(12) United States Patent
Itoh

(10) Patent No.: US 6,229,149 B1
(45) Date of Patent: *May 8, 2001

(54) ELECTRON BEAM DRAWING APPARATUS AND METHOD OF THE SAME

(75) Inventor: Hiroyuki Itoh, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/482,018

(22) Filed: Jan. 13, 2000

Related U.S. Application Data

(63) Continuation of application No. 08/854,386, filed on May 12, 1997, which is a continuation of application No. 08/501,225, filed on Jul. 11, 1995, now abandoned.

(30) Foreign Application Priority Data

Jul. 15, 1994 (JP) .................................................. 6-163553

(51) Int. Cl.[7] .................................................. H01J 37/302
(52) U.S. Cl. .......................................................... 250/492.23
(58) Field of Search ......................................... 250/492.23

(56) References Cited

U.S. PATENT DOCUMENTS 6,069,364 * 5/2000 Itoh ................................. 250/492.23

* cited by examiner

Primary Examiner—Jack Berman
(74) Attorney, Agent, or Firm—Kenyon & Kenyon

(57) ABSTRACT

It is an object of the present invention to reduce a number of deflection awaiting and a connection error between shots by scanning and exposing a formed beam having a large area. To achieve the object, a continuous scanning deflector and a scan limiter are added to a variable forming type electron beam column and the drawing is performed such that a state in which the electron beam is limited by the scan limiter is continuous to a state in which the electron beam is irradiated on a face of a sample. According to this structure, the number of deflection awaiting and the connection error between shots are reduced and further, a high-speed and highly accurate drawing of a 45° slanted figure is made possible.

3 Claims, 7 Drawing Sheets

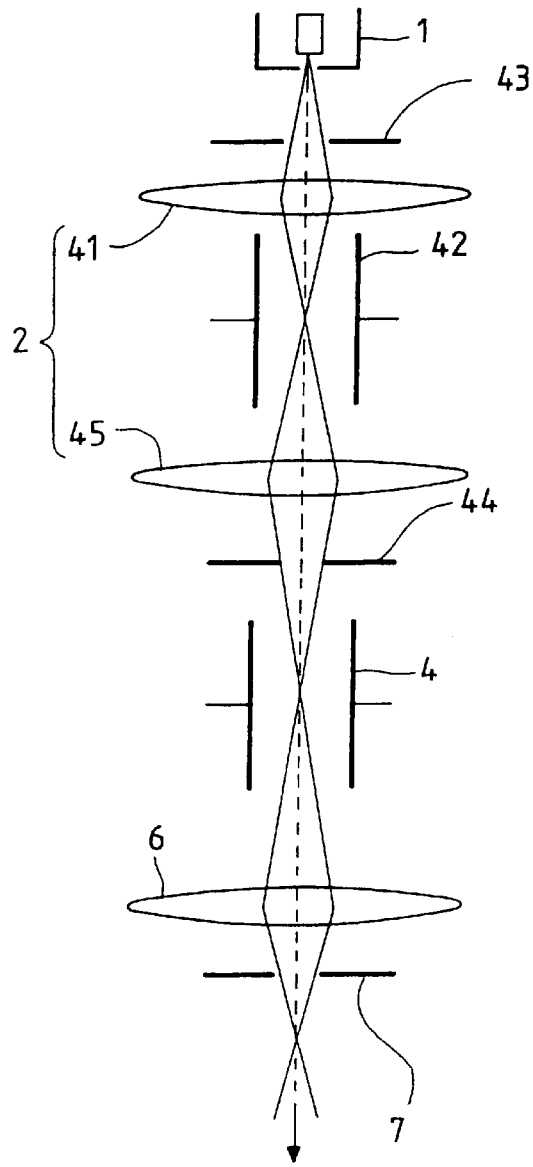
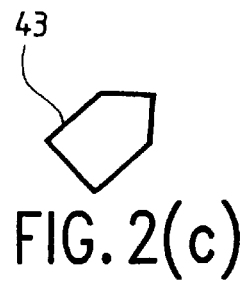
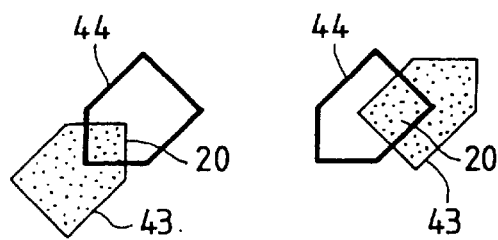
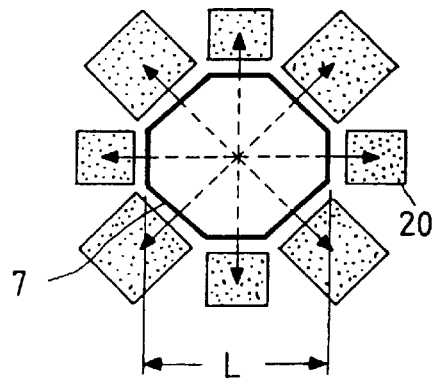
FIG. 2
FIG. 2(c)
FIG. 2(a)  FIG. 2(b)
FIG. 2(d)

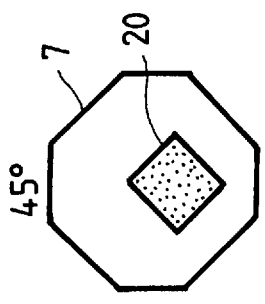
FIG. 3(a-2)
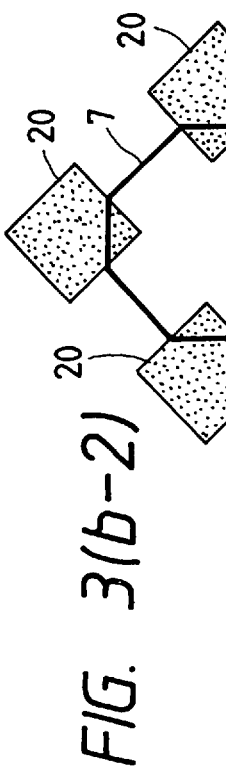
FIG. 3(b-2)
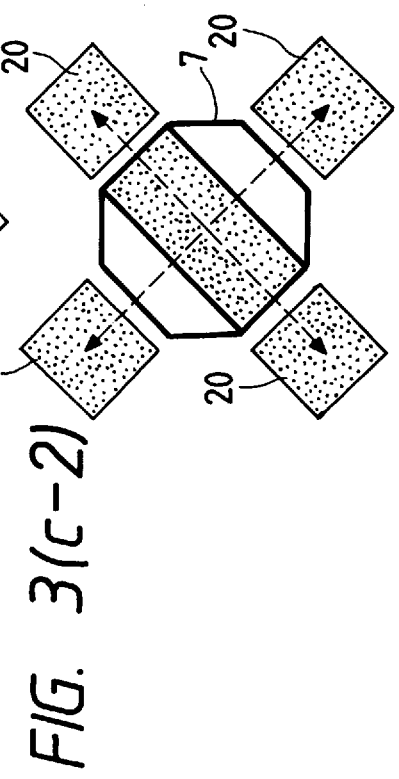
FIG. 3(c-2)
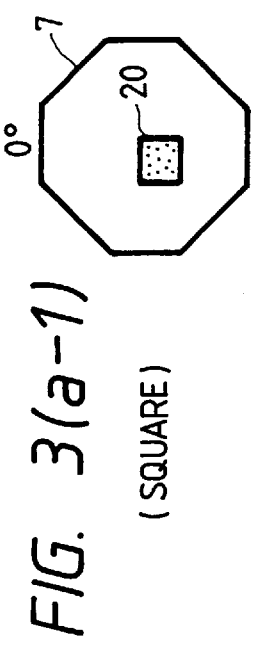
FIG. 3(a-1)
(SQUARE)
FIG. 3(b-1)
(TRIANGLE)
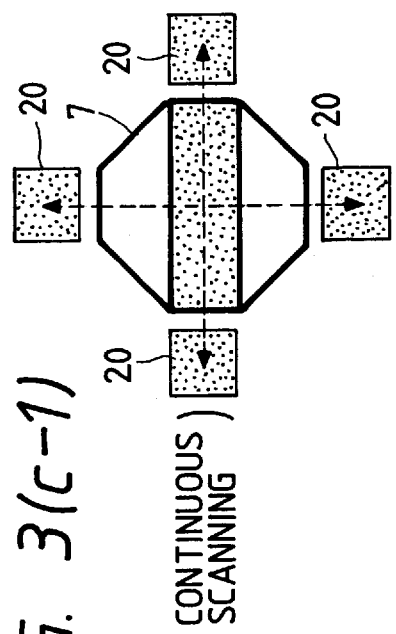
FIG. 3(c-1)
(CONTINUOUS SCANNING)

ELECTRON BEAM DRAWING APPARATUS AND METHOD OF THE SAME

This is a continuation of U.S. patent application Ser. No. 08/854,386, filed May 12, 1997, which is a File Wrapper Continuation of U.S. patent application Ser. No. 08/501,225, filed Jul. 11, 1995 now abandoned. This Application claims priority to Japanese Application No. 6-163553 filed on Jul. 15, 1994. A certified copy of the Japanese Application was filed Jul. 11, 1995.

BACKGROUND OF THE INVENTION

The present invention relates to an electron beam drawing apparatus and a method of electron beam drawing.

An electron beam drawing apparatus is an apparatus performing a predetermined drawing on a sample by irradiating an electron beam to a predetermined position, performing the irradiation after moving an irradiated portion and repeating the above steps (This technique is described in, for example, Japanese Unexamined Patent Publication No. 117325/1989). A drawing performed by this apparatus has advantages wherein a mask is not necessary and a high resolution is provided, for example, in comparison with a stepper, for example. In recent years, the electron beam drawing apparatus has been widely spread in a trial manufacture of a micro device, manufacturing of a special purpose (assigned) application specific integrated circuit (ASIC) and the like.

Conventionally, when an irradiated position of an electron beam is moved, the electron beam is deflected such that the electron beam does not reach a sample (blanking of the electron beam). Further, the electron beam drawing is performed such that the electron beam again reaches the sample when the irradiated position has been moved.

Meanwhile, a technology of drawing using an electron beam is considered by dispensing with the blanking to promote drawing speed. That is, the irradiated position of the electron beam is moved while the electron beam is kept irradiating on the sample.

However, when the irradiated position of the electron beam is moved in a state wherein the electron beam is kept irradiating on the sample in such a way, there is a nonuniformity of the amount of irradiating the electron beam in the moving direction of the electron beam at a start point and an end location of drawing. For example, at the start point of drawing, the amount of irradiating the electron beam at a position in the moving direction of the electron beam is larger than that at another position disposed opposite to the moving direction of the electron beam. The nonuniformity of the amount of irradiation of the electron beam causes dimming of a pattern edge.

An explanation will be given thereof as follows. For example, suppose that the width of a beam spot is determined as W and the electron beam is moved from left to right with a moving speed of v. When the electron beam begins to irradiate and thereafter, the electron beam is moved from left to right, the far left portion of the beam spot is in a state in which the electron beam is not irradiated at the instance of moving the electron beam. Similarly, a portion of the beam spot within a distance of w (w<W) from the center of the spot wherein the far left side of the spot is at a position having a distance of w when the electron beam begins to irradiate, is irradiated for a period of time of w/v. Therefore, the farther the left side portion is disposed, the shorter the time of irradiating the electron beam. Such a nonuniformity of the amount of irradiating the electron beam causes the dimming of a pattern edge. This is the same with respect to a finish portion of irradiating the electron beam.

SUMMARY OF THE INVENTION

The present invention relates to an electron beam drawing device and an electron beam drawing method restraining the dimming of pattern and capable of drawing at high speed.

According to an embodiment of the present invention, an electron beam is formed in a predetermined shape and is irradiated on a sample face while restricting a portion of the formed electron beam by a scan limit opening and the electron beam is moved within the scan limit opening in a state wherein the electron beam is being irradiated, thereby performing the drawing on a face of the sample.

According to the above-mentioned arrangement, it is possible to restrict the irradiation of the electron beam such that the electron beam is not irradiated by the scan limit opening on portions of the sample in which the dimming of pattern at the start and finish of the drawing are caused.

Therefore, a beam spanning over the whole width of the beam spot passes through any portion whether it is a portion of the start of irradiation of the electron beam or a portion of the finish of the irradiation thereof by using the scan limit opening. Therefore, the nonuniformity of the amount of irradiating the electron beam is restrained in that meaning. Accordingly, it is possible to restrain the dimming of a pattern edge caused by the nonuniformity of the amount of irradiating the electron beam.

BRIEF DESCRIPTION OF THE DRAWINGS

FIGS. 2, 2(*a*)–2(*d*) illustrate views showing details of a forming deflector and a scanning deflector in the first embodiment of the present invention.

FIGS. 3(*a*-1), 3(*a*-2), 3(*b*-1), 3(*b*-2), 3(*c*-1) and 3(*c*-2) are views showing formation of a beam spot shape in the first embodiment of the present invention.

DETAILED DESCRIPTION

Firstly, an explanation will be given of a basic way of thinking of embodiments of the present invention and successively a detailed explanation will be given of the embodiments of the present invention in reference to the drawings.

Generally, an exposure time T of an electron beam (EB) apparatus is determined by the following equation where a resist sensitivity is designated by S, a beam current density is designated by J, a deflection await time is designated by ts and a shot number is designated by N.

$T=(ts+S/J)N+to$ where to is an idle time due to overhead such as stage movement, sample interchange or the like. In the former system the exposure shot number N is reduced whereby high-speed drawing is realized. For example, it is necessary for reducing an actual exposure time (S/J)N by a variable forming method to enlarge beam dimensions and enhance current density. However, the maximum dimension and the current density of a used beam are actually restricted by a uniform irradiation range of an electron gun and beam dimming in proportion to irradiation current or a so-called Coulomb effect. In a case where the electrooptical system is optimized and the above-mentioned actual exposure time is reduced to the extreme, the problem is the deflection await time ts. For example, in a case of the spot beam, raster scanning is a method of effectively reducing the deflection await time ts. This is a method wherein a single pattern is exposed by scanning a beam at a constant speed without blanking. In this system there is no deflection await time in scanning and a high-speed drawing can be performed. Moreover, it has advantages wherein a connection error between the exposure shots is dispensed with in the scanning region, etc. However, in the variable forming system a pattern edge is dimmed at the start point and the finish point of continuous scanning.

Therefore, a scan limit opening is provided to block the electron beam at the start point and the finish point of the continuous scanning. In this way the pattern dimming at the starting point and the finish point of the continuous scanning can be restrained while maintaining a small deflection await time ts.

Figure 1:
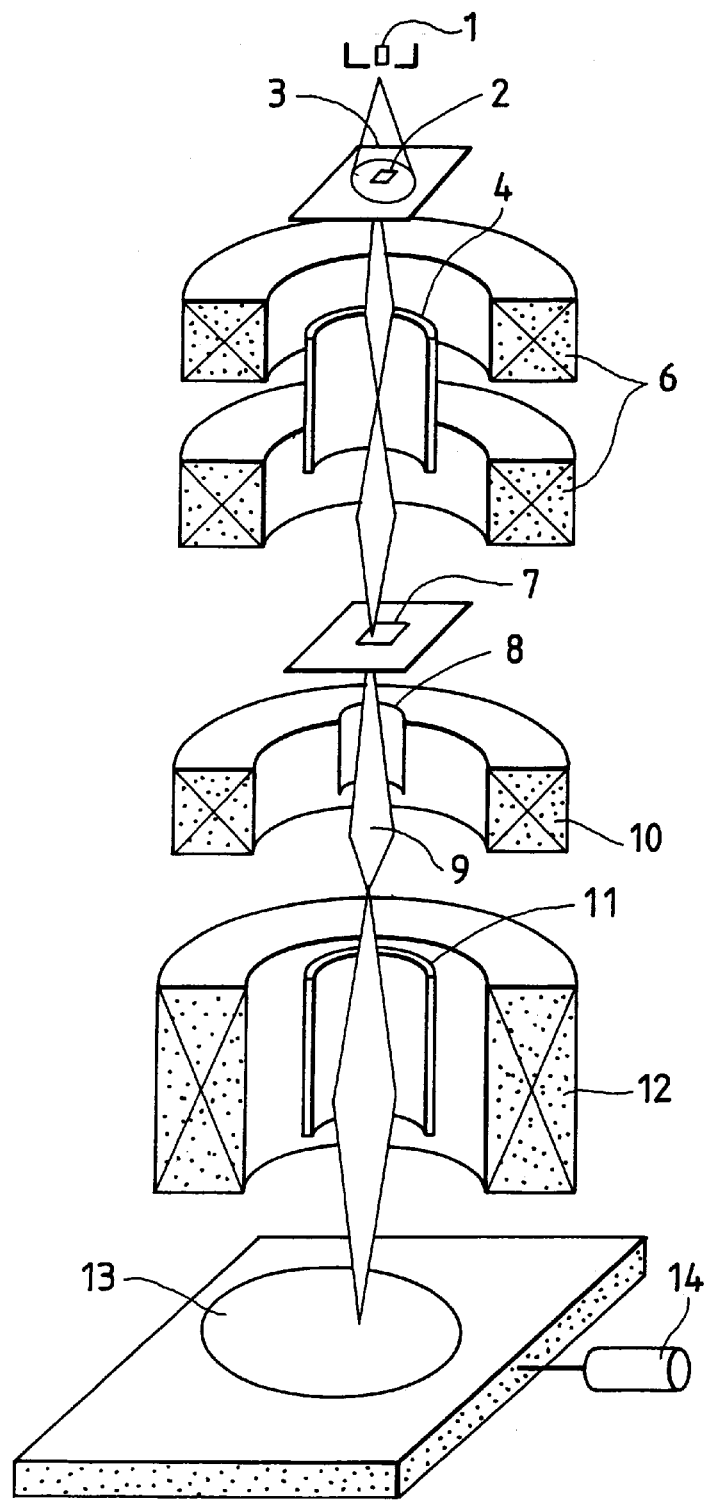
FIG. 1 is a view of an electrooptical system according to a first embodiment of the present invention.

A detailed explanation will be given of the embodiments of the present invention in reference to the drawings. First, an explanation will be given of a first embodiment of the present invention in reference to FIG. 1 through FIG. 5. FIG. 1 is an outline view of an electrooptical system of the present invention. An electron beam emitted from an electron source 1 is uniformly irradiated in an irradiation range 2 on a form opening 3. This irradiation range 2 restricts a transcribable range, that is, maximum dimensions of a formed beam. The electron beam formed by the form opening is image-formed on a scan limit opening by a forming lens 6, the image from the form opening 3 is positioned at a predetermined location of the scan limit opening 7 by a scan deflector 4. Here, the aperture dimension of the scan limit opening 7 is set as larger than the aperture dimension of the form opening 3. Further, the dimensions of the scan limit opening 7 is determined by a projection distortion of an object lens 12 at a lower stage and a deflection range of the scan deflector 4.

In a continuous scanning mode the scan deflector 4 scans at a constant speed from the outside of an end of the aperture of the scan limit opening 7 to the outside of another opposite end of the aperture thereof. In this way a band-like pattern 16 corresponding to a length of the scan limit opening 7 is exposed. An exposure width H, that is, a beam dimension Wo in a direction orthogonal to the scanning direction is determined by the scan deflector 4. The amount of exposure on the sample is adjusted by a scanning speed V. The scanning speed V is simply determined by V=JWo/S where S designates the resist sensitivity, J designates the current density and Wo designates a beam dimension in the scanning direction. In this relationship when Wo is increased, the scanning speed V is accelerated.

The formed beam is image-formed on a sample 13 by a condensing lens 10 and the object lens 12. The beam reduction ratio is determined by working accuracy of the scan limit opening etc. The irradiated position of the sample 13 is designated by an irradiation deflector 11 and a sample moving mechanism 14. A blanking car 8 for on and off of the beam is arranged for awaiting for the setting of the irradiation deflector 11 and the sample positioning mechanism 14 and for controlling the exposure time of the formed beam.

FIG. 2 shows details of a portion of FIG. 1 from the electron beam source 1 to the scan limit opening 7. The form opening 3 is constituted by a first form opening 43, a second form opening 44, a first forming lens 41, a second forming lens 42 and a forming deflector 45. The first form opening 43 and the second form opening 44 each is constituted by a pentagon including three right angles. Further, the first form opening 43 and the second form opening 44 are formed such that the both are provided with the same shape and the senses of direction thereof are mutually different from each other by 180°. The image of the first form opening is moved by a converging and deflecting operation of the forming lenses 41 and 42 and the forming deflector 42. A portion of the image is blocked by the second form opening 44 and is formed by selecting either one of a regularly erected rectangle beam and a rectangle beam slanted by 45°. The shape of the scan limit opening 7 is an octagon having internal angles of 45°. A band-like pattern is exposed by scanning a regularly erected rectangle beam 20 in X and Y direction or a 45° slanted rectangle beam 20 in a 45° direction from the outside of the aperture of the scan limit opening 7. The beam is cut also at a turning point and at the same time, the irradiation deflector 11 renews the irradiated position.

An explanation will be given of an image (image by overlapping the first form pattern 43 over the second form pattern 44), firstly with respect to a stationary drawing. In case of drawing a rectangular spot shape on the sample 13, the first form opening 43 and the second form opening 44 are arranged as shown in FIG. 2(*a*) or FIG. 2(*b*). Further, the image from the form opening 3 is positioned by the scanning deflector 4 such that it is not blocked by the scan limit opening 7. For example, the image from the form opening 3 is positioned at a location as in FIG. 3(*a*-1) or FIG. 3(*a*-2).

Further, the image from the form opening 3 is formed by the scan limit opening 7 by operating the scanning deflector 4 such that a portion of the image (image by overlapping the first form opening 43 over the second form opening 44) from the form opening 3 is blocked by the scan limit opening 7 when a triangular spot shape is drawn on the sample 13. That is, the beam spot shape is formed by overlapping the three openings of the first form opening 43, the second form opening 44 and the scan limit opening 7. For example, it is formed as in FIG. 3(*b*-1) and FIG. 3(*b*-2).

Further, an explanation will be given of scan drawing. A band-like pattern is exposed by scanning the image from the form opening 3 from the outside of the aperture of the scan limit opening 7 or scanning a 45°-slanted rectangular beam in a 45° direction. For example, the scanning is performed as in FIG. 3(*c*-1) and FIG. 3(*c*-2).

Figure 4:
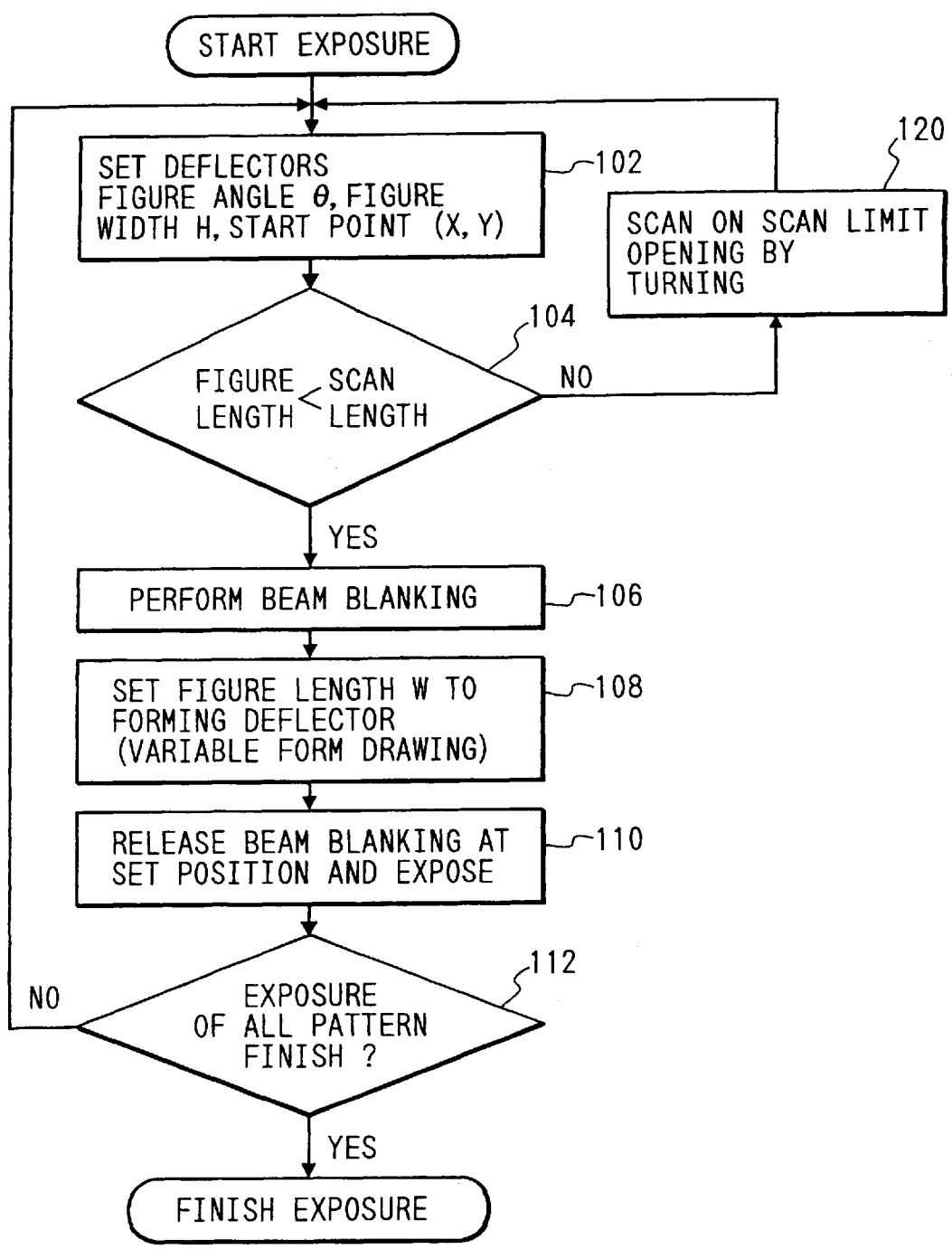
FIG. 4 is a flow chart showing a flow of drawing in the first embodiment of the present invention.

The exposing procedure is shown in FIG. 4. First, a figure angle θ, a figure width H, a start point (X, Y) are set (step 102). Whether the figure dimension W is to be exposed is in a continuous scan range, that is, whether a fraction of a scan length L or less is present is determined (step 104). When the figure dimension W is larger than L, the scanning is performed by turning at a scan start point and a scan finish point until unexposed portion becomes smaller than L (step 120). The irradiation deflector successively renews the irradiated position simultaneously with cutting the beam at the turning point. The fraction portion which is finally smaller than L is also exposed by the variable forming method. The on and off of the beam in this case is performed by the blanking car 8. In this way the band-like pattern can be exposed with a minimum deflection await time.

Meanwhile, in case where the figure dimension W to be exposed is smaller than the continuous scanning range L (step 104), the beam blanking is performed (step 106), the figure length W is set to the forming deflector 42, the beam blanking is released at the set position and exposing is performed (step 110). When the exposure of all the pattern is not finished (step 112), the flow is repeated.

Figure 5A:
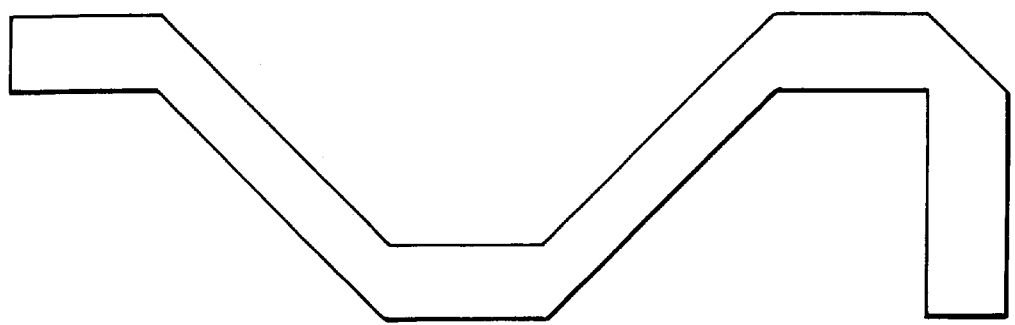
FIGS. 5(*a*) and 5(*b*) are views showing a specific exposure example.
Figure 5B:
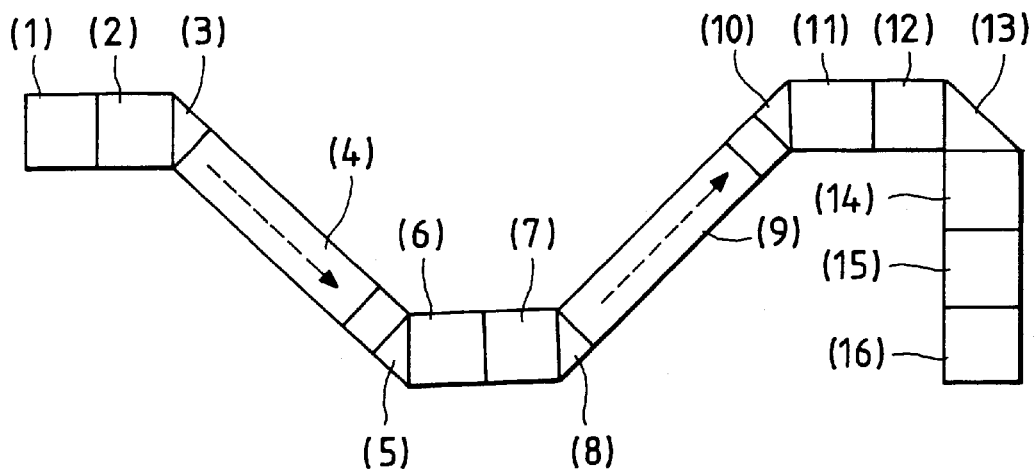

Next, an explanation will be given to a specific drawing. Now, suppose that a figure of FIG. 5(a) is drawn. In this case, the figure is divided into respective segments as in FIG. 5(b), the respectives are drawn by a stationary drawing or a scan drawing in an order from segments (1) to (16). Firstly, segment (1) is drawn as in FIG. 3(a-1), segment (2) is drawn as in FIG. 3(a-1), segment (3) forming a triangle with its apex directed to the right is drawn as in FIG. 3(b-2), segment (4) is drawn by a scan drawing from upper left to lower right as in FIG. 3(c-2), segment (5) forming a triangle with its apex directed to the left is drawn as in FIG. 3(b-2), segment (6) is drawn as in FIG. 3(a-1), segment (7) is drawn as in FIG. 3(a-1), segment (8) forming a triangle with its apex directed to the right is drawn as in FIG. 3(b-2), segment (9) is drawn by a scan drawing from lower left to upper right as in FIG. 3(c-2), segment (10) forming a triangle with its apex directed to the left is drawn as in FIG. 3(b-2), segment (11) is drawn as in FIG. 3(a-1), segment (12) is drawn as in FIG. 3(a-1), segment (13) forming a triangle with its apex directed to the lower left is drawn as in FIG. 3(b-1), segment (14) is drawn as in FIG. 3(a-1), segment (15) is drawn as in FIG. 3(a-1) and finally segment (16) is drawn as in FIG. 3(a-1) thereby finishing the drawing of the figure.

When the scanned beam is a variably formed beam, the beam dimension is maximized in the scanning direction to increase the drawing speed V. A variable rectangle in parallel with the scanning direction of the beam is also employed and the figure is drawn by edges of the scan limit opening with respect to the scanning direction and a direction orthogonal thereto. The drawing of a slanted figure having no connection which has been impossible to provide in principle except a spot beam can be performed at high speed by using the variable forming.

According to this embodiment, the variable rectangle in parallel with the scanning direction of the beam is employed and a band-like figure is drawn by edges of the scan limit opening with respect to the scanning direction and the orthogonal direction. Therefore, an effective drawing of the dividedly exposed portions having no deflection await time and no connection error can be performed by the variable forming. Further, the turning of the scanning is performed outside the opening and therefore, also the beam blanking function can simultaneously be realized. Further, a slanted line can be drawn at high speed when the shape of the scan limit opening is in agreement with the scanning direction. When a repeated figure is formed at the scan limit opening, a lump exposure can also be coped with.

Figure 6:
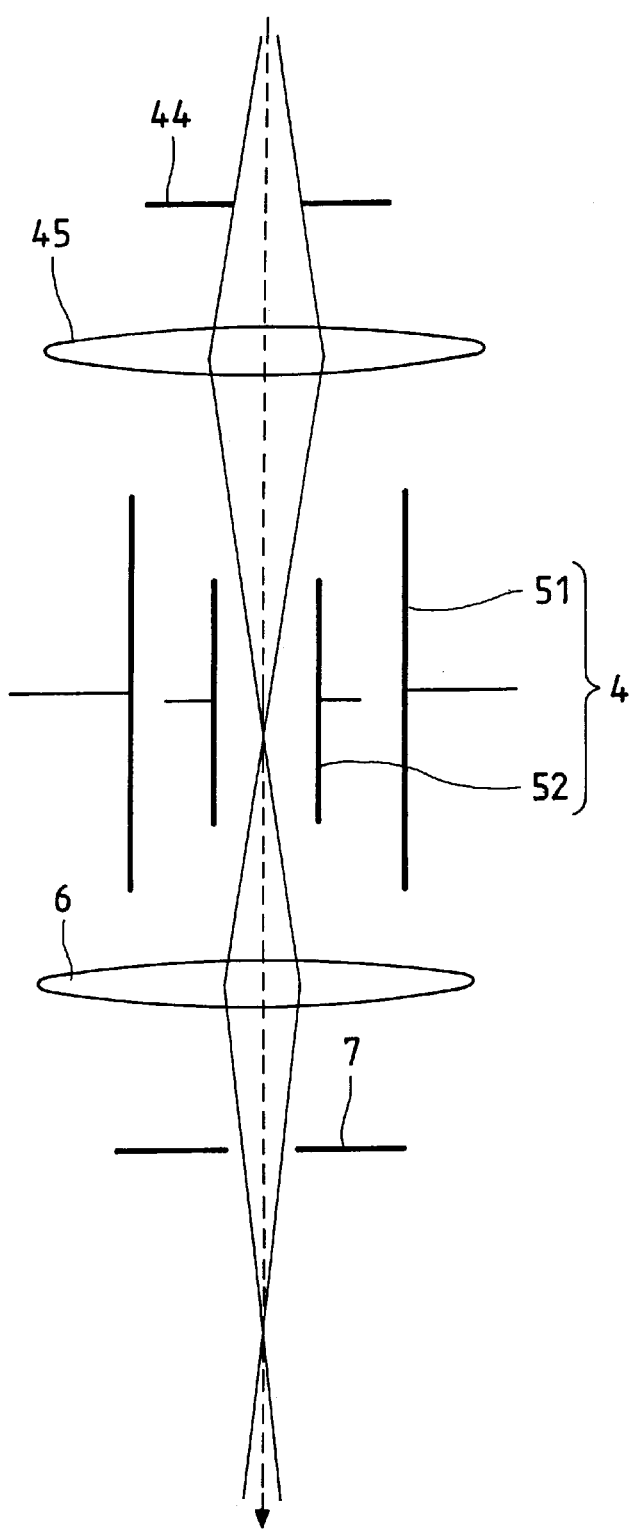
FIG. 6 is a view showing a second embodiment of the present invention.

Next, an explanation will be given of a second embodiment in reference to FIG. 6. Here, an explanation will be given of only portions different from those in the first embodiment to dispense with the explanation of the readjustment of the openings. In the second embodiment the scanning deflector 4 is constituted by a first scanning deflector 51 and a second scanning deflector 52, the first scanning deflector 51 is used exclusively for the stationary drawing and the second scanning deflector is used exclusively for the scan drawing. By using the respective deflectors exclusively in such a way, the response can be fast and the positioning control can be fine in the stationary drawing and the drawing speed can be accelerated in the scan drawing.

Figure 7:
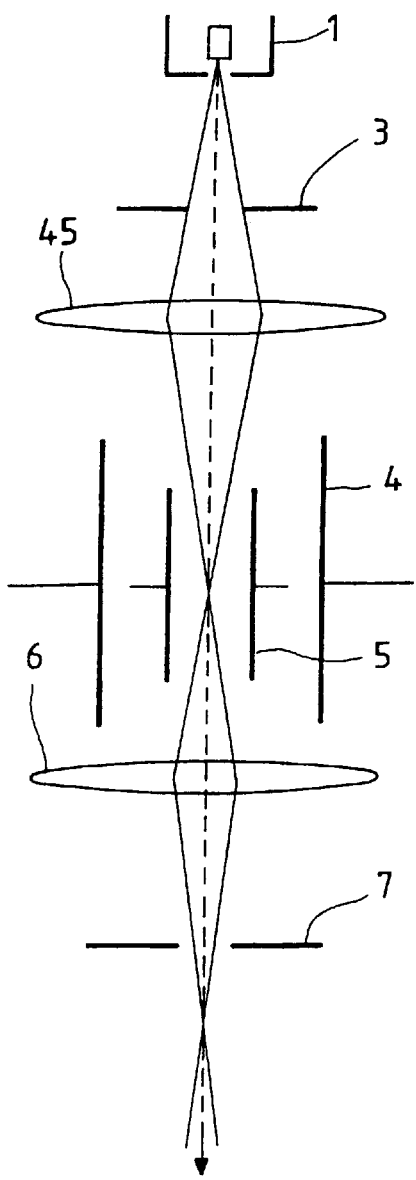
FIG. 7 is a view showing a third of the present invention.
Figure 7A:
Figure 7B:
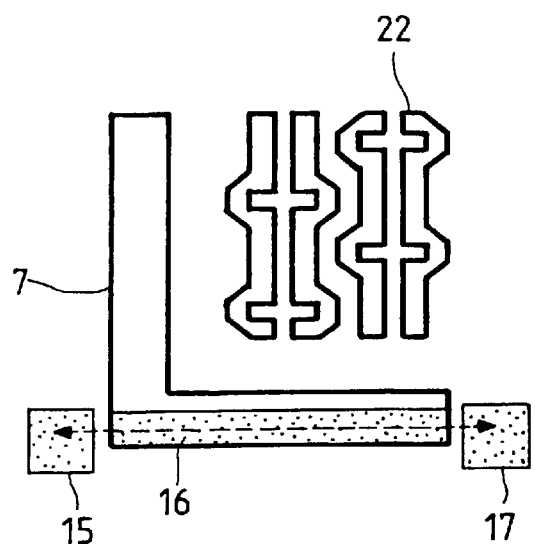

An explanation will be given of a third embodiment in reference to FIG. 7. This is an example wherein a lump exposure method is applied. Although the basic structure is the same as in FIG. 6 (second embodiment), an opening 22 for forming a repeatedly transcribed figure is formed on the second form opening. When the dimension D of a figure opening 22 of a transcribed figure is smaller than an image 15 from the first form opening, the location of the figure opening is selected by the scanning deflector 4 and exposure is performed. When a dimension D of the figure opening 22 is larger than the image 15 from the first form opening as in FIG. 5(a) and FIG. 5(b), the figure opening 22 is scanned by the scanning deflector 4 and is exposed. In this case fine adjustment of the exposure range is possible when the scanning range is restricted in accordance with the necessity.

As explained above, according to the present invention, it is possible that the electron beam is not irradiated on the sample at portions where the pattern dimming at the start and finish of drawing is caused. Therefore, the accuracy in the continuous drawing is promoted and a high-speed and accurate electron beam drawing becomes possible.

What is claimed is:

1. An electron beam drawing apparatus comprising:
    an electron source generating an electron beam;
    a forming unit forming the electron beam;
    a scan deflector scanning the electron beam formed by said forming unit; and
    a scan limiter which is disposed between said scan deflector and a sample to be irradiated blocking the formed electron beam to irradiate on the sample at the start point and the finish point of continuous scanning the formed electron beam on the sample.

2. An electron beam drawing apparatus according to claim 1, wherein said scan limiter has an opening which is larger than the electron beam formed by said forming unit and of which the shape is a polygon of which at least one side is incline.

3. An electron beam drawing method comprising the steps of:
    forming an electron beam in a predetermined shape;
    scanning said formed electron beam on a surface of a sample; and
    blocking said formed electron beam to irradiate on the surface of the sample at the start point and the finish point of continuous scanning the formed electron beam on the surface of the sample.

* * * * *